United States Patent [19]

Takata et al.

[11] Patent Number: 4,841,191
[45] Date of Patent: Jun. 20, 1989

[54] PIEZOELECTRIC ACTUATOR CONTROL APPARATUS

[75] Inventors: Keiji Takata, Tokorozawa; Masahide Okumura, Sagamihara; Satoru Fukuhara, Kokubunji; Toshiyuki Morimura, Hachioji; Sumio Hosaka, Nishitama; Shigeyuki Hosoki, Hachioji, all of Japan

[73] Assignee: Hitachi, Ltd., Tokyo, Japan

[21] Appl. No.: 153,006

[22] Filed: Feb. 8, 1988

[30] Foreign Application Priority Data

Feb. 20, 1987 [JP] Japan .................................. 62-35509
Feb. 20, 1987 [JP] Japan .................................. 62-35510

[51] Int. Cl.$^4$ ............................................ H01L 41/08
[52] U.S. Cl. .................................... 310/317; 310/316; 310/319; 310/328
[58] Field of Search .............. 310/316, 317; 318/116, 318/118

[56] References Cited

U.S. PATENT DOCUMENTS

| | | | |
|---|---|---|---|
| 3,868,698 | 2/1975 | Dressler | 310/317 X |
| 3,916,226 | 10/1975 | Knoll | 310/317 |
| 4,263,527 | 4/1981 | Comstock | 310/316 |
| 4,451,710 | 5/1984 | Taylor et al. | 310/317 X |
| 4,608,506 | 8/1986 | Tanuma | 310/315 |
| 4,689,514 | 8/1987 | Kondoh | 310/332 X |

*Primary Examiner*—Mark O. Budd
*Attorney, Agent, or Firm*—Antonelli, Terry & Wands

[57] ABSTRACT

Disclosed herein are a piezoelectric actuator control apparatus comprising a capacitor connected in series with a piezoelectric actuator that has electrodes, and a control device that controls the voltage applied to the piezoelectric actuator such that the voltage of the capacitor will reach a predetermined value, as well as a piezoelectric actuator control apparatus comprising an integrating circuit connected to one electrode of a piezoelectric actuator that has electrodes, and a control device that controls the voltage of the other electrode of the piezoelectric actuator such that the output of the integration circuit will assume a predetermined magnitude.

9 Claims, 5 Drawing Sheets

PIEZOELECTRIC ACTUATOR CONTROL APPARATUS

BACKGROUND OF THE INVENTION

The present invention relates to a piezoelectric actuator control apparatus, and more specifically to a piezoelectric actuator control apparatus adapted to driving piezoelectric actuators employed in a superfine positioning apparatus.

If a voltage is applied to a piezoelectric actuator to measure its extension, hysteresis is usually observed. The hysteresis, however, greatly decreases if the extension is measured with respect to the electric charge stored between electrodes of the piezoelectric actuator. The experimental results have been described in ELECTRONICS LETTERS, Vol. 18, No. 11, 1982, pp. 442–443.

Figure 1:
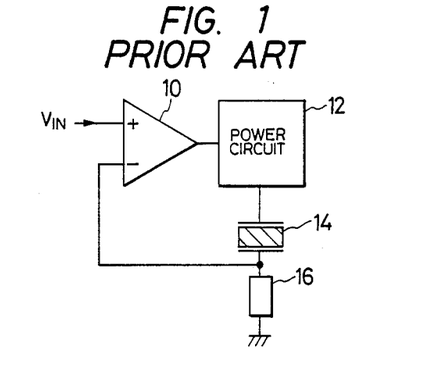
FIG. 1 is a circuit diagram of a conventional piezoelectric actuator control apparatus.

FIG. 1 illustrates the circuit used for the experiments. A resistor 16 is connected in series with a piezoelectric actuator 14, and the other end of the resistor 16 is grounded. A voltage at a connection point between the piezoelectric actuator 14 and the resistor 16 is input to the negative input terminal of an operational amplifier 10, and a control signal Vin is input to the positive input terminal of the operational amplifier 10. The output of the operational amplifier 10 is input to a power circuit 12. The output of the power circuit 12 proportional to the output of the operational amplifier 10 is transmitted. The circuit of FIG. 1 is a typical constant-current circuit which so works that a constant current flows into the resistor 16.

In this circuit, a voltage applied to the resistor 16 is brought to be equal to the input voltage Vin. This means that a constant current flows into the resistor 16 and the electric charge is stored in the piezoelectric actuator 14 at a constant rate with respect to the time.

If the displacement is measured while the electric charge Q is being accumulated in the piezoelectric actuator 14 at a constant rate, there are obtained displacement characteristics that are nearly in proportional to the amount of electric charge. The above prior art, however, does not have a function to impart electric charge of a given amount to the piezoelectric actuator or to hold the electric charge of a given amount, in order to maintain constant the amount of displacement of the piezoelectric actuator. Summary of the Invention:

The object of the present invention is to provide a piezoelectric actuator control apparatus which controls the amount of electric charge imparted to the piezoelectric actuator in order to maintain constant the amount of displacement of the piezoelectric actuator.

In order to achieve the above object, the present invention deals with a piezoelectric actuator control apparatus which comprises a piezoelectric actuator having a material that produces strain upon application of an electric field and having electrodes for applying an electric field to said material, a capacitor connected in series with said piezoelectric actuator, and control means which applies a voltage to the piezoelectric actuator so that said capacitor will assume a predetermined voltage.

In general, the electrostatic capacity of the piezoelectric actuator does not remain constant for the voltage that is applied thereto. The electric charge Q involves a large hysteresis with respect to the applied voltage, and it is difficult to find the amount of electric charge Q directly from the applied voltage.

Figure 5:
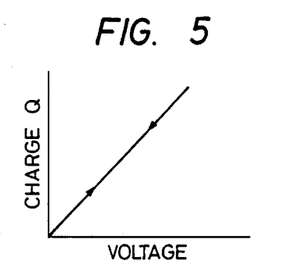
FIG. 5 is a diagram of characeristics illustrating a relationship between the voltage applied to the capacitor and the amount of electric charge according to the present invention.

Therefore, a capacitor is connected in series with the piezoelectric actuator to store therein the electric charge Q of an amount equal to the electric charge Q induced in the piezoelectric actuator. Since the electrostatic capacity of the capacitor remains constant, the amount of electric charge Q of the capacitor is proportional to the voltage applied thereto without involving any hysteresis (FIG. 5).

More preferably according to the present invention, a capacitor is connected between one electrode of the piezoelectric actuator and a reference potential, provision is made of an operational amplifier which received a potential at the connection point between the capacitor and the piezoelectric actuator as well as a control signal, and which produces signal based upon a difference therebetween, and the potential of another electrode of the piezoelectric actuator is controlled based upon the signal produced from the operational amplifier.

A voltage Vin is input to the input terminal of the operational amplifier. Under the initial condition, the potential at a connection point between the capacitor and the piezoelectric actuator is equal to a reference potential. The electric charge of an equal amount is stored in the piezoelectric actuator and in the capacitor owing to the voltage produced by the operational amplifier. If the electrostatic capacity of the capacitor is denoted by Q, the operational amplifier so works that the electric charge $Q = CVin$ will be stored.

Figure 6:
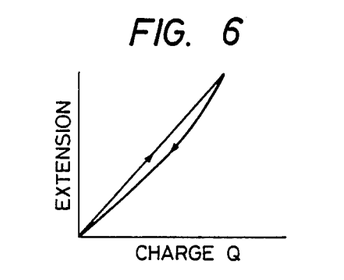
FIG. 6 is a diagram of characteristics illustrating a relationship between the amount of electric charge of the piezoelectric actuator and the amount of extension according to the present invention.

Therefore, a given electric charge Q determined by Vin in imparted to the piezoelectric actuator and is held therein. FIG. 6 shows displacement characteristics. The input voltage Vin and the electric charge Q establish a proportional relationship $Q = CVin$ without involving hysteresis.

According to the present invention, furthermore, an integrating circuit is connected in series with one electrode of the piezoelectric actuator, and the potential of the other electrode of the piezoelectric actuator is so controlled that the integrating circuit will produce an output of a predetermined value.

The integrating circuit is provided to integrate a current i that flows into the piezoelectric actuator. The amount of electric charge Q is detected from $Q = it$ (t denotes the time). The voltage applied to the piezoelectric actuator is controlled by the electric charge Q that is detected.

This makes it possible to control the piezoelectric actuator relying upon the amount of electric charge. That is, the electric charge of a given amount is imparted to the piezoelectric actuator and is held therein.

DETAILED DESCRIPTION OF THE PREFERRED EMBODIMENTS

Figure 2:
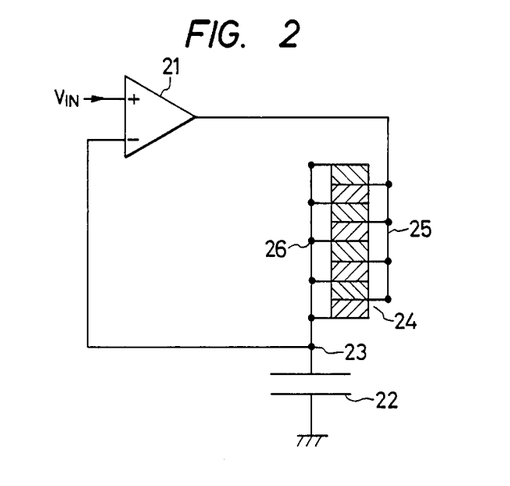
FIG. 2 is a circuit diagram of a piezoelectric actuator control apparatus according to an embodiment of the present invention.

An embodiment of the invention will now be described in conjunction with FIG. 2. The output terminal of an operation amplifier 21 is connected to an electrode 25 of a piezoelectric element 24 whose other electrode 26 is connected to a capacitor 22 having an electrostatic capacity C. A connection point 23 between them is connected to the negative input terminal of the operational amplifier 21. The other end of the capacitor 22 is connected to ground potential. The piezoelectric actuator 24 is of the stack type which produces a large displacement with a low voltage.

Next, the operation will be described. The operational amplifier 21 applies a voltage from its output terminal to the electrode 25 so that a voltage applied to the negative input terminal thereof will become equal to the voltage at the positive input terminal. An electric charge Q generates in the piezoelectric actuator 24 and an electric charge Q of an equal amount generates in the capacitor 22, too. The operation converges at a moment when the electric charge Q=CVin is stored. When the voltage Vin at the positive input terminal decreases, the electric charge stored in the piezoelectric actuator 24 is discharged via the operational amplifier 21, and an electric charge porportional to the control voltage Vin is stored in the piezoelectric actuator. The displacement characteristics with respect to the electric charge Q. Since the piezoelectric actuator is of the stack type, a sufficiently large displacement is obtained being driven by an output from the operational amplifier 21.

Figure 3:
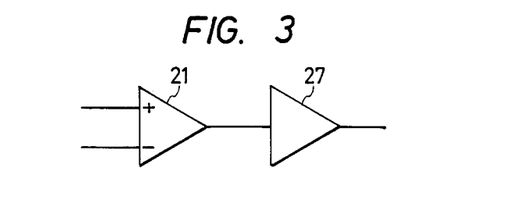
FIG. 3 is a block diagram illustrating a circuit for amplifying the voltage.

When the output voltage of the operational amplifier 21 is so small that sufficiently large displacement is not obtained, the voltage is amplified to a suitable level through a high-voltage output amplifier 27 to drive the piezoelectric actuator as shown in FIG. 3.

The method of controling the amount of electric charge of the piezoelectric actuator according to the present invention is effective in determining the position of a stage of an electron beam lithograph apparatus in the order of microns or smaller and in finely determining the positions of an electron optical system such as an aperture or a cathode.

Figure 4:
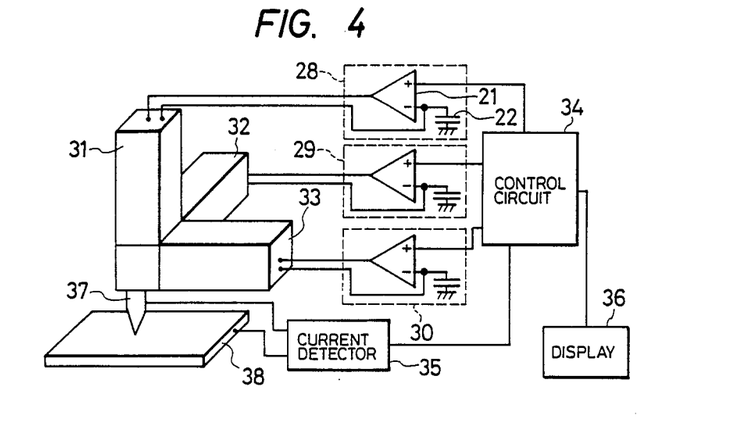
FIG. 4 is a schematic diagram which illustrates the case where the piezoelectric actuator control apparatus of the prsent invention is adatpted to a scanning tunneling electron microscope (STM)

FIG. 4 illustrates an example in which the present invention is applied to a scanning tunneling microscope (STM).

A probe tip 37 and a specimen 38 are as close as about 10 angstroms relative to each other. A current detector 35 permits a tunneling current to flow between them and sends a current value to a control circuit 34 which causes the probe tip 37 to carry out the scanning two-dimensionally along the surface of the specimen while adjusting the gap between the probe tip 37 and the specimen 38 so that a constant tunneling current flows. Upon receipt of a signal from the control circuit 34, a piezoelectric actuator 31 adjusts the gap and piezoelectric actuator 32 and 33 carry out the scanning. Displacement data of the piezoelectric actuators 31, 32 and 33 are displayed on a display 36; i.e., there is obtained an STM image which enables the surface condition of the specimen to be observed in an atomic order.

The conventional STM image displays the applied voltage based on an assumption that the amount of displacement of a piezoelectric actuator varies in proportion to the applied voltage. Therefore, the image is distorted due to non-linearity in the amount of displacement and hysteresis with respect to the applied voltage.

According to this embodiment, the piezoelectric actuators 31, 32 and 33 are driven by electric charge control circuits 28, 29 and 30 which supply to the piezoelectric actuators 31, 32 and 33 the electric charges of amounts determined by signals from the control circuit 34. Therefore, a display of signals from the control circuit 34 is equal to a display of electric charges in the piezoelectric actuators. Displacement by the electric charge involves little hysteresis and is more linear (see FIG. 6). Therefore, there is obtained an image that is distorted very little.

The present invention can be adapted to any apparatus similar to the STM, such as an apparatus which measures the temperature distribution of a specimen by scanning the surface of the specimen using a thermocouple as a probe or an apparatus which scans and controls a particular probe or a specimen using a surface roughness measuring device or a piezoelectric actuator. A scanning X-ray microscope and a scanning electron microscope that scan the specimen using piezoelectric actuators can be included in this scope.

Figure 7:
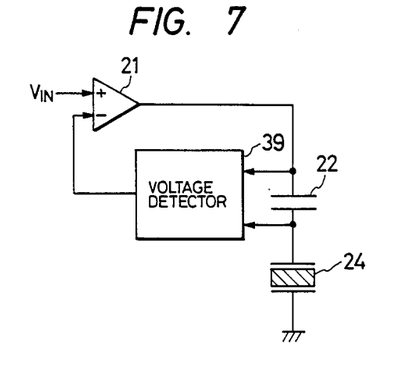
FIG. 7 is a circuit diagram of a piezoelectric actuator control apparatus according to another embodiment of the present invention.

FIG. 7 illustrates another embodiment of the present invention. A capacitor 22 is connected to the output terminal of an operational amplifier 21, and is further connected to a piezoelectric actuator 24. The potential difference across the capacitor 22 is detected by a voltage detector 39 and is input to the negative input terminal of the operational amplifier 21.

According to this embodiment, the piezoelectric actuator 24 and the capacitor 22 are connected in series, the voltage applied to the capacitor 22 is detected and is fed back to obtain quite the same results as those of the above-mentioned embodiment. The order of connecting the capacitor 22 and the piezoelectric actuator 24 does not create any essential problem.

According to this embodiment, one electrode of the piezoelectric actuator 24 can directly be grounded. When the piezoelectric actuator 24 is used in vacuum, therefore, only one input terminal is needed presenting advantage.

Figure 8:
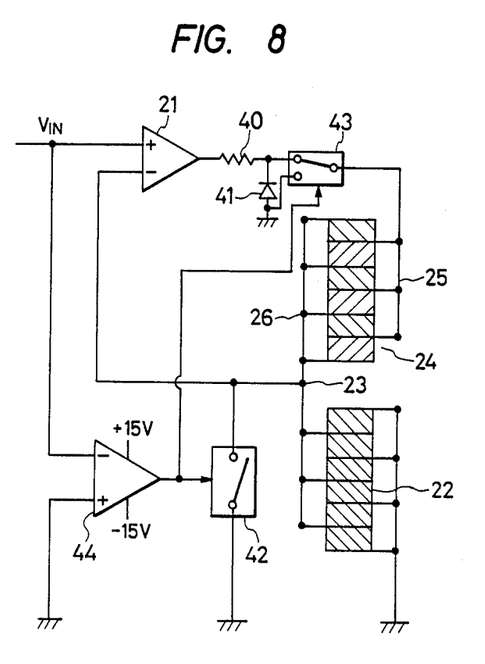
FIG. 8 is a circuit diagram of a piezoelectric actuator control apparatus according to a further embodiment of the present invention.

A further embodiment of the invention will be described in conjunction with FIG. 8.

A piezoelectric actuator 24 and a capacitor 22 are connected in series with each other. An end of the capacitor 22 is grounded and an end of the piezoelectric actuator 24 is connected to the output terminal of an operational amplifier 21. A resistor 40 and a diode 41 work to prevent the oscillation and to prevent the electrode from assuming a negative potential.

The potential at a connection point 23 is fed back to the negative input terminal of the operational amplifier 21, and a control voltage Vin is input to the positive input terminal thereof.

A switch 42 is provided between the connection point 23 and ground potential, and another switch 43 is provided between the resistor 40 and the electrode 25, the two switches being opened and closed in response to an output signal from the operational amplifier 44. The voltage Vin is input to the negative input terminal of the operational amplifier 44 whose positive input terminal is connected to ground potential.

The operation will now be described. As the signal Vin in input to the operational amplifier 21, a voltage is applied to the electrode 25 so that the connection point 23 will assume the potential Vin. Owing to the feedback function of the operational amplifier 21, an electric charge Q=CVin (C denotes an electrostatic capacity of the capacitor 22) is stored in the piezoelectric actuator 24. The electric charge of any amount can be imparted to the piezoelectric actuator 24 depending upon the input signal Vin.

The operational amplifier 44 works as a comparator. When Vin>0 V, a voltage of −15 V is applied to the switches 42 and 43. In this case, the switch 42 remains turned off. The switch 43 assumes the state where the electrode 25 is connected to the output terminal of the operational amplifier 21. When Vin≦0 V, a voltage of 15 V is applied to the switch 42 to turn it on. The switch 43 assumes the state where the electrode 25 is grounded.

Described below is the case where a predetermined amount of electric charge Qo is imparted to the piezoelectric actuator 24 and is held therein. The potential at the connection point 23 increases when the leakage current of the piezoelectric actuator 24 is greater than that of the capacitor 22. Therefore, the potential of the electrode 25 decreases and the amount of displacement Δlo of the piezoelectric actuator 24 decreases. The situation is reversed when the leakage current of the piezoelectric actuator 24 is smaller than that of the capacitor 22.

In this case, the input voltage Vin is set to be Vin≦0 V to close the switch 42, and the connection point 23 is grounded. At the same time, the electrode 25 is grounded, too. This operation eliminates the effect of leakage current. By inputting a voltage Vin=Qo/C to the operational amplifier 21, there is obtained a displacement Δlo. Suitable resistances R inserted between the switches 42, 43 and ground helps prevent the piezoelectric actuator 24 from being broken down.

According to this embodiment, the capacitor 22 is comprised of a ceramic capacitor of which the structure resembles that of the piezoelectric actuator of the stack type. Furthermore, the electrostatic capacity C is so selected that C=(C$_P$·R$_1$)/R$_2$ (R$_1$: insulation resistance of the piezoelectric actuator 24, R$_2$: insulation resistance of the capacitor 22, C$_P$: average electrostatic capacity of the piezoelectric actuator 24). Therefore, since the voltage proportional to the insulation resistance is applied and since the structure resembles, too, the leakage current flows into the piezoelectric actuator 24 and into the capacitor 22 in an almost equal amount.

Figure 9:
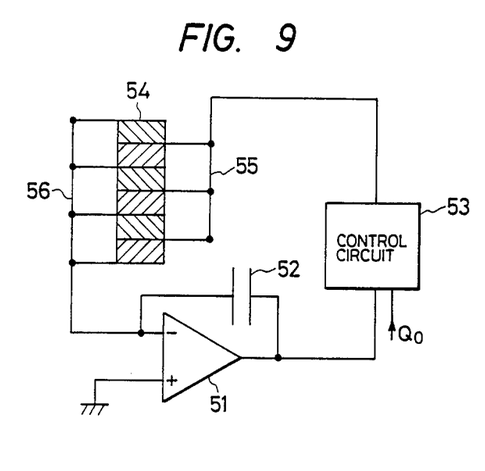
FIG. 9 is a circuit diagram of a piezoelectric actuator control apparatus according to a still further embodiment of the present invention.

Next, a still further embodiment of the invention will be described in conjunction with FIG. 9.

An electrode 56 of a stack type piezoelectric actuator 54 that produces a great displacement with a relatively low application voltage is connected to the negative input terminal of an operational amplifier 51. The positive input terminal is connected to ground potential. A capacitor 52 is connected between the negative input terminal of the operational amplifier 51 and the output terminal thereof. The signal from an integrating circuit consisting of the operational amplifier 51 and the capacitor 52 is input to a control circuit 53 to determine the potential at the electrode 55 of the piezoelectric element 54. The operational amplifier 51 employed here has a very small bias current.

The control circuit specifies a predetermined amount of electric charge and applies a voltage to the electrode 55. An electric charge is stored between the electrodes 55 and 56. If the effect of bias current is neglected, the electric charge of an equal amount is stored in the capacitor 52, too. If the electrostatic capacity of the capacitor 52 is denoted by C, a voltage Q/C is produced when the electric charge Q is stored. The control circuit 53 controls the potential of the electrode 55 so that the electric charge Q that is determined by the output signal will become equal to the predetermined amount of electric charge Qo.

Figure 10:
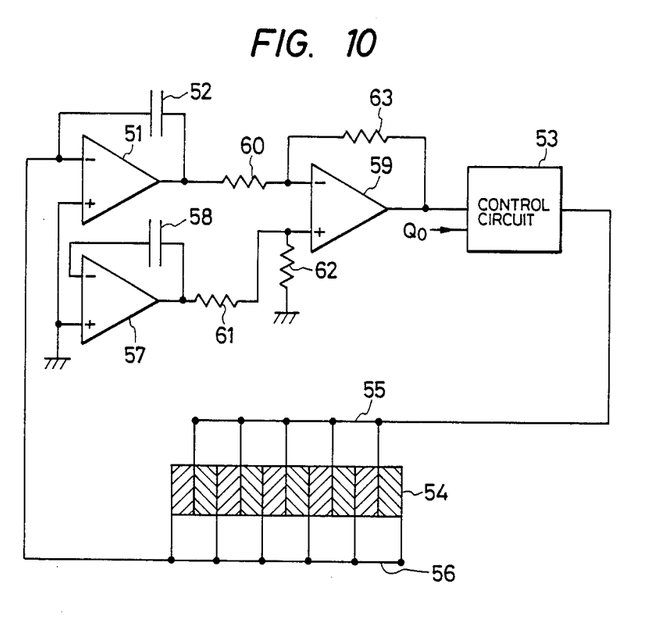
FIG. 10 is a circuit diagram of a piezoelectric actuator control apparatus according to yet further embodiment of the present invention.

FIG. 10 illustrates an embodiment in which the integration circuit is improved. That is, in addition to the above-mentioned integration circuit, there is provided another integration circuit which is constructed quite in the same manner. Here, however, the negative input terminal is open. Namely, an operational amplifier 57 and a capacitor 58 constitute the integration circuit. Signals from the operation amplifiers 51 and 57 are input to an operational amplifier 59, and a difference between these signals is sent to the control circuit. Resistors 60, 61, 62 and 63 have the same resistance.

A bias current, though it is very small, flows into the operational amplifiers. Therefore, output signals of the integration circuits consisting of operational amplifiers and capacitors undergo the drift though the amount is very small. According to this embodiment, however, the integration circuit constitutes a differential amplifier to eliminate most of the effects caused by the drift.

Figure 11:
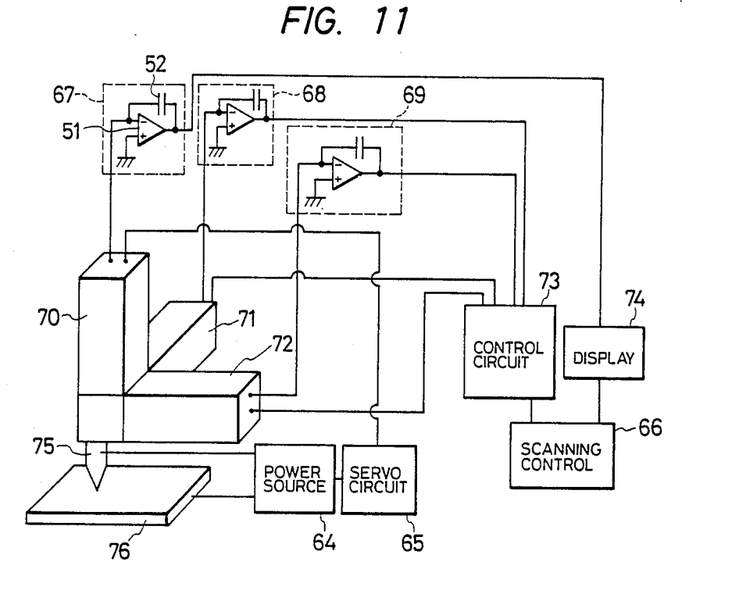
FIG. 11 is a schematic diagram which illustrates the case where the piezoelectric actuator control apparatus of the present invention is adapted to controlling the STM.

FIG. 11 illustrates an embodiment of when the present invention is adapted to the scanning tunneling electron microscope (STM).

A probe tip 75 and a specimen 76 are brought very close to each other, and a current is suppplied to them from a power source 64. A servo circuit 65 applies a voltage to a piezoelectric actuator 70 and controls the gap between the probe tip 75 and the specimen 76 so that a constant current flows therebetween.

On the other hand, a scanning controller 66 sends synchronized scanning signals of the form of waves to both a control circuit 73 and a display 74. In response to signals from the integrating circuits 68 and 69, the control circuit 73 gives to the piezoelectric actuators 71 and 72 electric charge of an amount that is proportional to the scanning signal. Therefore, the probe tip 75 performs the scanning two-dimensionally along the surface of the specimen. The signal from the integrating circuit 67 is displayed on the display 74 in a form that corresponds to the position of the probe tip 75 on the sample.

The conventional STM was not provided with an electric charge control and detection system that was comprised of control circuit 73 and integration circuits 67, 68 and 69. In the conventional STM, the scanning signal voltage from the scanning controller 66 is directly applied to the piezoelectric actuators 71 and 72, and the output voltage sent from the servo circuit 65 to the piezoelectric actuator 70 is directly displayed on the display 74. Therefore, the STM image is distorted due to non-linearity of the displacement quantity and hysteresis.

According to this embodiment, the distortion greatly decreases owing to the control of electric charge of the piezoelectric actuator and the display of the amount of electric charge.

Figure 12:
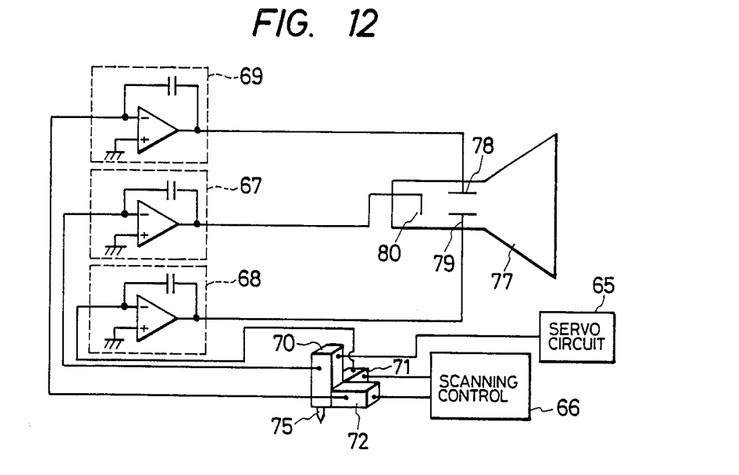
FIG. 12 is a schematic diagram which illustrates another case where the piezoelectric control apparatus of the present invention is adapted to controlling the STM.

FIG. 12 shows an embodiment of the STM which displays only the amount of electric charge. In this embodiment, the control circuit 73 of FIG. 11 is not provided, and the scanning signal is directly supplied to the piezoelectric actuators 71 and 72. A display 77 corresponds to the display 74. The structure, in other respects, is the same as the structure of FIG. 11.

Electric charges of the piezoelectric actuators 71 and 72 are detected by the integrating circuits 68 and 69 and are input to x- and y-scanning systems 78 and 79 of the display 77. The electric charge of the piezoelectric actuator 70, on the other hand, is detected by the integrating circuit 67, input to the cathode 80 and is used as a brightness signal for the display 77.

According to this embodiment, distortion in the image is greatly reduced by displaying the amount of electric charge without controlling the amount of electric charge.

Here, in order to minimize the effect of bias current of the operational amplifier, it is recommended to set the application voltage to each of the piezoelectric actuators to be zero after each shot of STM image and, at the same time, to discharge the capacitors that constitute integration circuits.

This makes it possible to minimize the effect of output signals of the integrating circuits that change with the lapse of time.

According to the present invention in which the piezoelectric actuators are controlled relying upon the amounts of electric charge, there are obtained displacement characteristics having excellent linearity and small hysteresis. It is further possible to greatly decrease the drift (creep) in the amount of displacement as a predetermined voltage is applied to the piezoelectric actuators, by using the apparatus of the present invention that is capable of maintaining a constant amount of electric charge.

What is claimed is:

1. A piezoelectric actuator control apparatus comprising:
   a stack type piezoelectric actuator which has a material that develops strain upon application of an electric field and which further has electrodes for applying an electric field to said material;
   a capacitor connected in series with said piezoelectric actuator, said capacitor being comprised of a stack type ceramic capacitor having a structure substantially the same as that of said piezoelectric actuator to thereby cause the leakage currents flowing in the capacitor and in said piezoelectric actuator to be substantially equal to each other; and
   control means which controls a voltage applied to said piezoelectric actuator so that a voltage of said capacitor will reach a predetermined value.

2. A piezoelectric actuator control apparatus according to claim 1, wherein one electrode of said capacitor is connected to a reference potential.

3. A piezoelectric actuator control apparatus comprising:
   a stack type piezoelectric actuator which has a material that develops strain upon application of an electric field and which further has electrodes for applying an electric field to said material;
   a capacitor connected between one electrode of said piezoelectric actuator and a reference potential, said capacitor being comprised of a stack type ceramic capacitor having a structure substantially the same as that of said piezoelectric actuator to thereby cause the leakage currents flowing in the capacitor and in said piezoelectric actuator to be substantially equal to each other; and
   an operational amplifier which receives a control signal and a potential at a connection between said capacitor and said one electrode of said piezoelectric actuator and which produces a signal based upon the difference therebetween;
   wherein the potential of another electrode of the piezoelectric actuator is controlled based upon the output signal of said operational amplifier.

4. A piezoelectric actuator control apparatus according to claim 3, wherein the potential at the connection point of said capacitor and said electrode of said piezoelectric actuator is input to the negative input terminal of said operational amplifier, and said control signal is input to the positive input terminal of said operational amplifier.

5. A piezoelectric actuator control apparatus according to claim 3, further including an amplifier between said operational amplifier and the other electrode of said piezoelectric actuator.

6. A piezoelectric actuator control apparatus according to claim 3, further including means for setting the voltage across the terminals of said piezoelectric element and the voltage across the terminals of said capacitor to zero.

7. A piezoelectric actuator control apparatus comprising:
   a piezoelectric element which has a material that develops strain upon application of an electric field and which further has electrodes for applying an electric field to said material;
   an integrating circuit connected to one electrode of said piezoelectric element; and
   control means which controls the potential of the other electrode of said piezoelectric element so that the output of said integrating circuit will assume a predetermined magnitude.

8. A piezoelectric actuator control apparatus according to claim 7, wherein said integrating circuit consists of an operational amplifier which has a negative input terminal connected to one electrode of the piezoelectric element and a positive input terminal connected to a reference potential, and a capacitor connected between the negative input terminal of said operational amplifier and the output terminal thereof.

9. A piezoelectric actuator control apparatus comprising:
   a piezoelectric element which has a material that develops stain upon application of an electric field and which further has electrodes for applying an electric field to said material;

an integrating circuit connected to one electrode of said piezoelectric element, said integrating circuit consisting of an operational amplifier which has a negative input terminal connected to one electrode of the piezoelectric actuator and a positive input terminal connected to a reference potential, and a capacitor connected between the negative input terminal of said operational amplifier and the output terminal thereof;

control means which controls the potential of the other electrode of said piezoelectric element so that the output of said integrating circuit will assume a predetermined magnitude;

a second integration circuit consisting of a second operational amplifier whose negative input terminal is open and a capacitor which is connected between the negative input terminal of said second operational amplifier and the output terminal of said second operational amplifier; and a third operational amplifier which sends to said control means a differential signal between the output of said integration circuit and the output of the second integration circuit.

* * * * *